US006670852B1

United States Patent
Hauck

(10) Patent No.: US 6,670,852 B1
(45) Date of Patent: Dec. 30, 2003

(54) OSCILLATOR TUNING METHOD

(75) Inventor: Lane T. Hauck, San Diego, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/981,448

(22) Filed: Oct. 17, 2001

(51) Int. Cl.[7] .............................................. H03L 7/00
(52) U.S. Cl. ......................... 331/1 A; 331/44; 331/17; 327/156; 327/159; 327/160
(58) Field of Search ..................... 331/17, 1 A, 176, 331/44; 327/159, 156, 160

(56) References Cited

U.S. PATENT DOCUMENTS 5,892,408 A * 4/1999 Binder ........................ 331/44
6,345,079 B1 * 2/2002 Ohishi ........................ 375/373

OTHER PUBLICATIONS

"1kHz to 30MHz Resistor Set SOT–23 Oscillator", Initial Release Final Electrical Specifications LTC1799, Linear Technology Corporation, Jan. 2001, pp. 1–4.

"CY7C63221/31A enCoRe™ USB Low–Speed USB Peripheral Controller", Cypress Semiconductor Corporation, Jan. 16, 2001, pp. 1–42.

CY7C63722/23—CY7C63742/43 enCoRe™ USB Combination Low–Speed USB & PS/2 Peripheral Controller, Cypress Semiconductor Corporation, May 25, 2000, pp. 1–48.

* cited by examiner

Primary Examiner—Arnold Kinkead
(74) Attorney, Agent, or Firm—Christopher P. Maiorana, P.C.

(57) ABSTRACT

An apparatus comprising an output circuit and a control circuit. The output circuit may be configured to generate an output signal oscillating at a frequency in response to a control signal. The control circuit may be configured to generate the control signal in response to (i) a frequency of said input signal when in a first mode and (ii) a stored value when in a second mode.

23 Claims, 3 Drawing Sheets

US 6,670,852 B1

OSCILLATOR TUNING METHOD

FIELD OF THE INVENTION

The present invention relates to a method and/or architecture for implementing oscillators generally and, more particularly, to a method and/or architecture for calibrating the operating frequency of a self contained, on-chip oscillator, using a single pin.

BACKGROUND OF THE INVENTION

Conventional oscillators use external components (i.e., crystals, RC networks, resistors, etc.), to tune the operating frequency. Manufacturers typically factory trim the oscillator die and optionally fine tune the die with in-system measurements of known events in time to tune the oscillators. However, such tuning configurations are typically restricted to parameters such as die trim when the final package is pin limited and cannot include pins for fine tuning. Furthermore, in-system tuning can be relatively complex and can involve extra pins, special test modes, complex procedures, and specialized equipment.

It is generally desirable to provide simple on-chip tuning for oscillators using a limited number of pins and commonly available lab test equipment.

SUMMARY OF THE INVENTION

The present invention concerns an apparatus comprising an output circuit and a control circuit. The output circuit may be configured to generate an output signal oscillating at a frequency in response to a control signal. The control circuit may be configured to generate the control signal in response to (i) a frequency of said input signal when in a first mode and (ii) a stored value when in a second mode.

The objects, features and advantages of the present invention include providing a method and/or architecture for setting the operating frequency of a self contained, on-chip oscillator that may (i) be implemented using a single pin, (ii) allow accuracy to be determined by a signal source plus internal resolution, (iii) provide easy in-system features, (iv) be implemented without additional programming and/or (v) be implemented without special configuration modes such as a programming mode requiring special pins, modes, or programming voltages.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
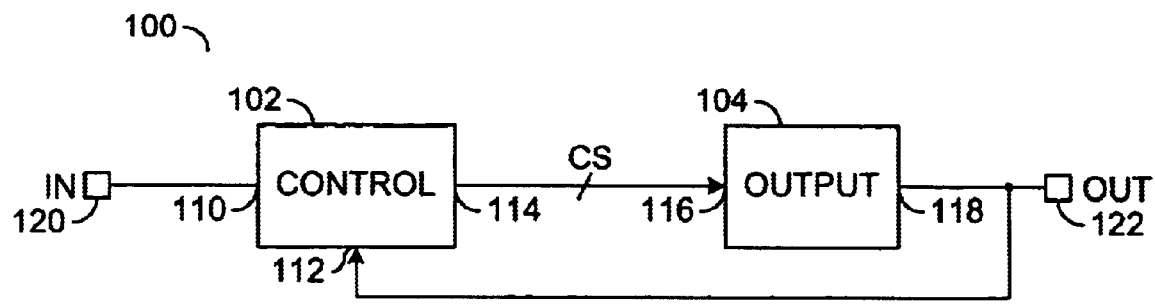
FIG. 1 is a block diagram of a preferred embodiment of the present invention.

Referring to FIG. 1, a block diagram of a system (or circuit) 100 is shown in accordance with a preferred embodiment of the present invention. The circuit 100 may be implemented as an integrated circuit (IC) on a single package (or die). The circuit 100 may allow an operating frequency of a self-contained, on-chip oscillator to be set via a single pin. The present invention may also provide a method for tuning an oscillator.

The circuit 100 generally comprises a control block (or circuit) 102 and an output block (or circuit) 104. The control circuit 102 may have an input 110 that may receive a signal (e.g., IN), an input 112 that may receive a signal (e.g., OUT) and an output 114 that may present a signal (e.g., CS). The signal IN may be a periodic signal having a reference frequency. The signal OUT may be implemented as an output signal that may oscillate at a particular frequency. The signal CS may be implemented as a single-bit or a multi-bit control signal. The frequency of the signal OUT may be tuned in response to the frequency of the signal IN. The circuit 102 may be configured to generate the signal CS in response to the signals IN and OUT. The control circuit 102 may be configured to tune the frequency of the signal OUT.

The output circuit 104 may have an input 116 that may receive the signal CS and an output 118 that may present the signal OUT. The signal CS may be used to tune the circuit 104. The circuit 104 may be configured to generate the signal OUT in response to the signal CS. The signal IN may be received on a pin (or terminal) 120. The signal OUT may be presented on a pin 122.

Figure 2:
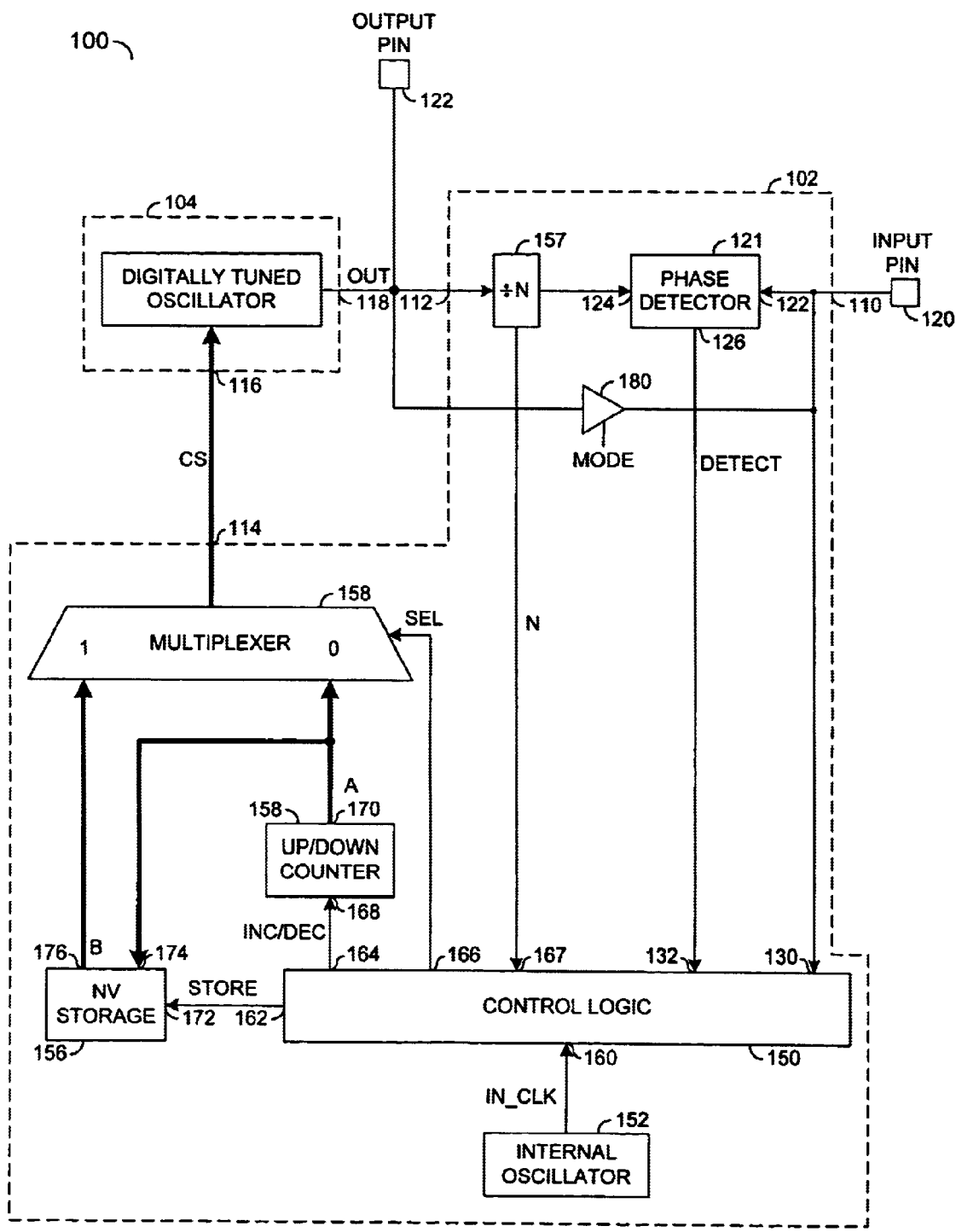
FIG. 2 is a detailed block diagram of the circuit of FIG. 1.

Referring to FIG. 2, a more detailed block diagram of the circuit 100 is shown. In one example, the output circuit 104 may be implemented as a digitally tuned oscillator. However, other types of oscillators may be implemented accordingly to meet the design criteria of a particular application. The control circuit 102 may comprise a phase detector 121, a control logic block (or circuit) 150, an oscillator 152, a counter 154, a storage device it 156, a divide block (or circuit) 157 and a multiplexer 158. The phase detector 121 may be configured to detect and compare a phase of the signal IN with a phase of the signal OUT. The phase detector 121 may have an input 122 that may receive the signal IN, an input 124 that may receive the signal OUT through the divider 157 and an output 126 that may present a signal (e.g., DETECT). The phase detector 121 may be configured to generate the signal DETECT in response to the signal IN and the signal OUT. The signal DETECT may be implemented to indicate phase and/or frequency differences between the signal IN and the signal OUT. The signal DETECT may be implemented as a single-bit or a multi-bit signal. The comparison of (difference between) the phases may be presented as the signal DETECT.

The control logic 150 may have an input 130 that may receive the signal IN and an input 132 that may receive the signal DETECT. The control logic 150 may also have an input 160 that may receive a signal (e.g., IN_CLK), an output 162 that may present a signal (e.g., STORE), an output 164 that may present a signal (e.g., INC/DEC), an output 166 that may present a signal (e.g., SEL) and an output 167 that may present a divide signal (e.g., N). The signal IN_CLK may be an internal oscillator signal. The signals STORE, INC/DEC, N and SEL may be control signals. The control logic 150 may be configured to generate the signals STORE, INC/DEC and SEL in response to one or more of the signals IN, DETECT and IN_CLK.

The oscillator 152 may be implemented as an internal oscillator. The control logic 150 may be clocked by the internal oscillator 152 via the signal IN_CLK. The frequency (or accuracy) of the signal IN_CLK is generally non-critical because the signal IN_CLK generally controls the timing of calibration operational steps, not the frequency of the output signal OUT.

The counter 154 may be implemented as an up/down counter. The counter 154 may have an input 168 that may receive the signal INC/DEC. The counter 154 may also have an output 170 that may present a signal (e.g., A). The counter 154 may generate the signal A in response to the signal INC/DEC. The signal A may be a configuration (or calibration) value for the circuit 100.

In one example, the storage device 156 may be implemented as a non-volatile storage device (e.g., EEPROM, Flash, Single-poly EPROM, other non-volatile floating gate technologies, etc.). RAM storage where the contents of the RAM are maintained for an extended period (more than 1 year) by an external battery source would also be within the scope contemplated by the present invention as well as any method of memory that is erasable and electrically programmable. The storage device 156 may be configured to store a configuration (or calibration) value of the circuit 100. The storage device 156 may have an input 172 that may receive the signal STORE and an input 174 that may receive the signal A. The storage device 156 may also have an output 176 that may present a signal (e.g., B). The storage device 156 may be configured to generate (modify) the signal B in response to the signal STORE and the signal A. The storage device 156 may be configured to store the value A when prompted via the signal STORE. The storage device 156 may also be configured to present the value B during an operational (e.g., non-calibration) mode of the circuit 100.

The multiplexer 158 may have a first input that may receive the signal A, a second input that may receive the signal B, a select input that may receive the signal SEL and an output that may present the signal CS. The signals A and B may be implemented as multi-bit or single-bit signals. The multiplexer 158 generally passes either the signal A or the signal B as the signal CS in response to the signal SEL. The signal CS may be implemented as a multi-bit or single-bit signal.

When the control logic 150 detects the periodic signal IN, the device 100 may be configured to enter a calibration mode. While in the calibration mode, the control logic 150 may assert the signal SEL having a first state that may cause the multiplexer 158 to route (or pass) the first input (e.g., the signal A) to the output (e.g., the signal CS). The multiplexer 158 may pass a digital value of the signal A from the up/down counter 154 to the digitally tuned oscillator 104. The control logic 150 may increment or decrement the counter 154 via the signal INC/DEC. The counter 154 may be incremented/decremented until the phase detector 121 indicates that the frequency IN and the frequency OUT (from the digitally tuned oscillator 104) are similar in response to a predetermined criteria. The accuracy of the frequency match may be determined, in one example, by the resolution of counter 154. The counter 154 may also set the step size for frequency adjustments applied to the oscillator 104.

In one example, the circuit 100 may be implemented as a phase-lock loop (PLL). The PLL 100 may be "locked" when the output DETECT (of the phase detector 121) is within a predetermined criteria. Once the PLL 100 is locked, the control logic 150 may implement the signal INC/DEC to stop the counter 154. The control logic 150 may then activate the signal STORE. The signal STORE may cause the digital value A from the up/down counter 154 to be stored in the non-volatile storage device 156. When the storage operation is complete, the control logic 150 may control the device 100 to exit the calibration mode and enter a normal operation mode.

To enter the operational mode, the control logic 150 may assert the signal SEL having a second state that may cause the multiplexer 158 to route the second input (e.g., the signal B) to the output (e.g., the signal CS). The multiplexer 158 may then pass the value B as the signal CS to the oscillator 104. The circuit 100 may use the value B stored in the non-volatile storage device 156 for tuning the oscillator 104, via the signal CS. The device 100 may continue to generate the signal OUT having the frequency similar to the signal IN even when the signal IN is no longer applied to the input pin 120.

The control logic 150 may be implemented as a state machine, a microcontroller, dedicated logic, or other appropriate type of device to meet the design criteria of a particular implementation. The control logic 150 may implement various search methods for controlling the counter 154 to achieve loop lock. For example, the control logic 150 may implement a simple up/down ramp, binary search, or other appropriate method. The control logic 150 may be configured to wait a predetermined amount of time (e.g., employ a time constant) after every frequency step (e.g., a modification of the output A) of the counter 154 to allow the phase detector 121 to settle.

Optionally, the input pin 120 (e.g., the signal IN) and output pin 122 (e.g., the signal OUT) may be combined on a common pin to lower overall pin count. In one example, a tri-state buffer (not shown) may be connected between the signal OUT and the common pin. The tri-state buffer may be in a high-impedance state (disabled) for the calibration mode and enabled for the operational mode.

The device 100 may also be configured to notify a user when calibration is finished. For example, the device 100 may gate the signal OUT off during calibration, and on when calibration is complete, where the onset of the oscillator signal OUT on the pin 122 may indicate the operational mode. Alternatively, the control logic 150 may be configured to generate a signal (e.g., DONE) that may be presented to an additional output pin (not shown) indicating a current mode of the circuit 100 (e.g., calibrate or operational mode).

The device 100 may also be configured to present the signal OUT at terminal 122 having a frequency that is a multiple of the calibration frequency applied as the signal IN. The divide circuit 157 may be implemented as a "divide by N" counter interposed between the input 112 of the circuit 102 and the input 124 of the circuit 121. The divider 157 may be controlled by the signal N received from the control logic 150. When N=1, the operational output frequency of the signal OUT is generally the same frequency as the calibration frequency of the signal IN. As an example of frequency multiplication, when N=2, the frequency of the signal OUT is generally twice the frequency of the applied calibration signal IN. The multiplicative values may be controlled using additional input pins to the control logic 150 (not shown).

Frequency multiplication may make the circuit 100 more useful since a common lab function generator may not generate a high enough frequency for calibration. For example, if an output frequency of 48 MHz is needed, but a particular lab generator can only generate 20 MHz, the circuit 100 may be configured to multiply by 4 while receiving a 12 MHz calibration signal.

Figure 3:
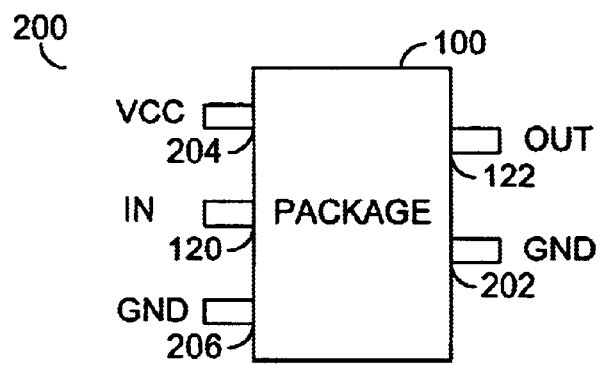
FIG. 3 is a block diagram of an exemplary implementation of the present invention.

Referring to FIG. 3, a circuit 200 is shown illustrating an implementation of the circuit 100. The circuit 200 may provide a stand-alone implementation of the circuit 100. For example, the circuit 200 may be implemented as a single package that may be easily tuned.

Once implemented, the reference frequency IN may be applied to the pin 120. After a predetermined time (or as indicated by a done pin implemented in place of a ground pin 202), the reference frequency signal IN may be removed from the pin 120. The output pin 122 may then present a signal with substantially the same frequency as applied via the signal IN (e.g., within a predetermined oscillator tolerance). Alternately, the absence or presence of an oscillator signal OUT at the terminal 122 may be used as a calibrate/operate indication. The package 200 may also have a pin 204 that may be coupled to a supply voltage VCC and a pin 206 that may be coupled to the ground GND.

Figure 4:
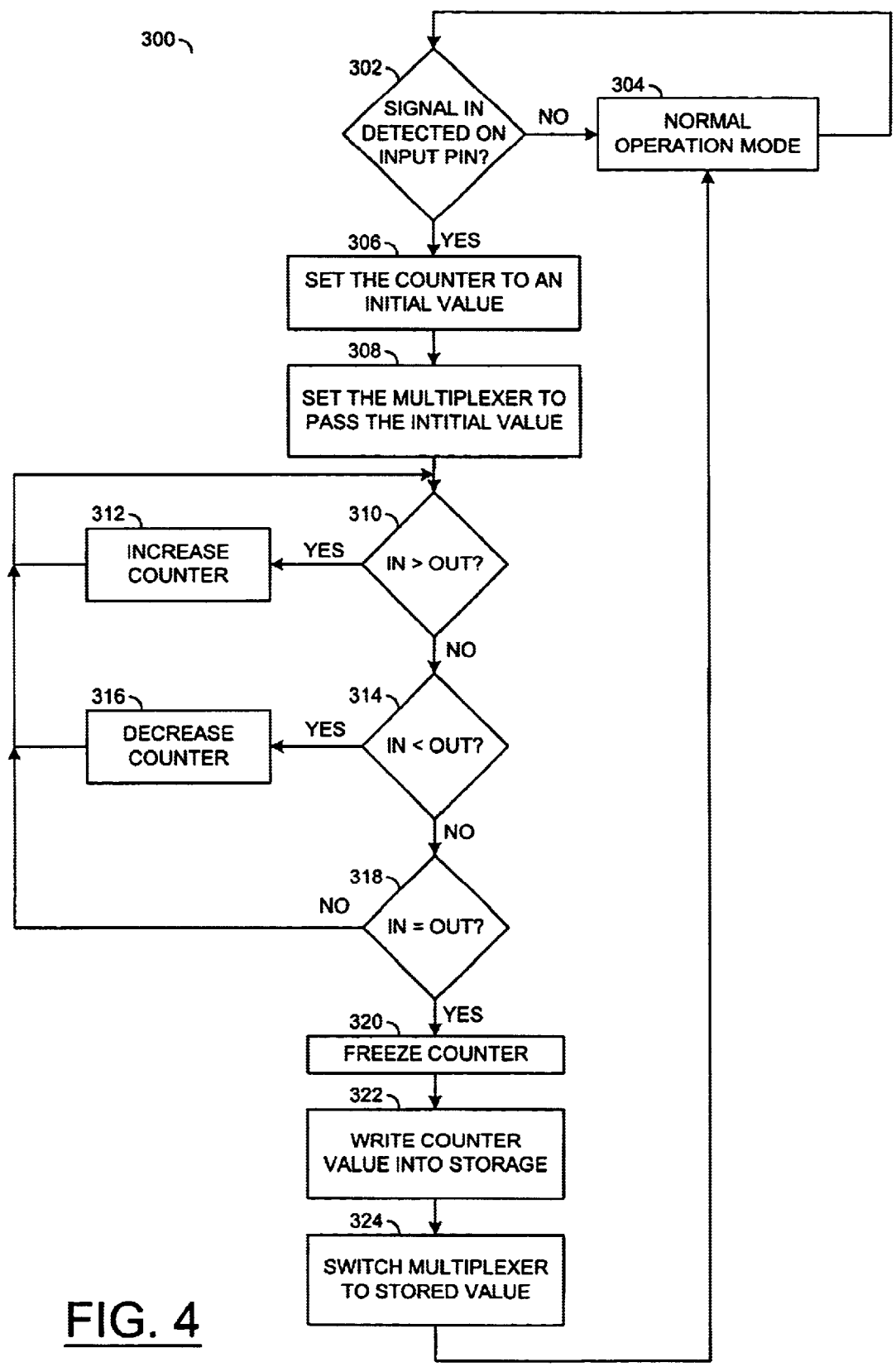
FIG. 4 is a flow chart illustrating an operation of the present invention.

Referring to FIG. 4, a flow chart 300 of a tuning procedure (or process) is shown. The flow chart 300 may illustrate a tuning procedure of the circuit 100 and/or 200. The method 300 generally comprises a decision state 302, a state 304, a state 306, a state 308, a decision state 310, a state 312, a decision state 314, a state 316, a decision state 318, a state 320, a state 322 and a state 324. The state 304 may represent the normal operation mode. The states 306–324 may represent steps of the calibration operation mode.

While in the decision block 302, the method 300 may determine whether the signal IN is present. When the signal IN is not detected the method 300 may continue to the state 304. While in the state 304, the method 300 may allow the circuit 100 to operate in a normal operation mode. While in the normal operation mode (e.g., the state 304) the circuit 100 may allow the multiplexer 154 to select the stored value B and the oscillator 104 may be tuned using the stored value from the non-volatile storage 156 to generate the output frequency OUT. The state 304 may return to the decision state 302 periodically.

When the signal IN is detected at the decision state 302, the method 300 may proceed to the state 306. While in the state 306, the method 300 may set the counter 154 to an initial value. The method 300 may then proceed to the state 308. While in the state 308, the method 300 may set the multiplexer 158 to pass the counter value A. The method 300 may then proceed to the decision state 310 after a predetermined settling interval.

While in the decision state 310, the method 300 may determine whether the input frequency IN is greater than the output frequency OUT. When the input frequency IN is greater than the output frequency OUT, the method 300 may increase the count of the counter 154 while at the state 312. The method 300 may then return to the decision state 310. When the input frequency IN is not greater than the output frequency OUT, the method 300 may proceed to the decision state 314.

While in the decision state 314, the method 300 may determine whether the input frequency IN is less than the output frequency OUT. When the input frequency IN is less than the output frequency OUT, the method 300 may decrease the count of the counter 154 while at the state 316. The method 300 may then return to the decision state 310. When the input frequency IN is not greater than and not less than the output frequency OUT, the method 300,may proceed to the decision state 318.

While in the decision state 318, the method 300 may determine whether the input frequency IN is equal to the output frequency OUT. When the output frequency OUT is not equal to the input frequency IN, the method 300 may then return to the decision state 310. When the input frequency IN is equal to the output frequency OUT, the method 300 may proceed to the state 320. The state 318 may respond to a predetermined criteria (e.g., a predetermined tolerance).

While in the state 320, the method 300 may freeze the counter 154. The method 300 may then proceed to the state 322. While in the state 322, the method 300 may write the current value (e.g., the value A) from the counter 154 into the non-volatile storage 156. The method 300 may then proceed to the state 324. While in the state 324, the method 300 may switch the multiplexer 158 to the second input to route the value B from the storage 156 to the oscillator 104. The method 300 may then return to the state 304.

The circuit 100 may tune (set) the operating frequency of an on-chip oscillator using a single pin. The circuit 100 may provide in-system tuning. The circuit 100 may have a simple implementation. The circuit 100 may allow an external reference frequency to set the operating frequency of the on-chip oscillator. The circuit 100 may allow the input and output frequencies to be shared on a single pin, further reducing pin count. The circuit 100 may provide an accuracy of the output frequency OUT determined by a frequency accuracy of an input signal plus the internal resolution of the counter 154. Additionally, the circuit 100 may eliminate special modes for tuning.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation. Additionally, inverters may be added to change a particular polarity of the signals.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a first circuit configured to generate an output signal oscillating at a first frequency in response to a first control signal; and
   a second circuit configured to (a) receive a calibration signal oscillating at a second frequency and (b) generate said first control signal in response to (i) a counter value when in a first mode and (ii) a stored value when in a second mode, wherein, while in said first mode, said counter value is adjusted in response to a difference between said first frequency and said second frequency.

2. The apparatus according to claim 1, wherein said stored value is calibrated when said apparatus is in said first mode.

3. The apparatus according to claim 1, wherein said first circuit comprises a digitally tuned oscillator.

4. The apparatus according to claim 1, wherein said counter value is adjusted in response to a phase difference between said output signal and said calibration signal.

5. The apparatus according to claim 4, wherein said second circuit is further configured to generate a detect signal in response to said phase difference.

6. The apparatus according to claim 5, further comprising a logic circuit configured to replace said stored value with said counter value in response to said detect signal.

7. The apparatus according to claim 1, wherein said second mode comprises a normal operation mode and said first mode comprises a calibration mode.

8. The apparatus according to claim 1, wherein said second circuit comprises:

a phase detector configured to generate a detect signal in response to said calibration signal and said output signal.

9. The apparatus according to claim 8, wherein said second circuit further comprises:

a logic circuit configured to generate a plurality of second control signals in response to said input signal and said detect signal; and a counter configured to generate said counter value in response to at least one of said plurality of second control signals.

10. The apparatus according to claim 1, wherein said second circuit is configured to generate said first control signal such that said first frequency is a multiple of said second frequency.

11. An apparatus comprising:

means for generating an output signal oscillating at a first frequency in response to a control signal; and means for generating said control signal in response to (i) a counter value when in a first mode and (ii) a stored value when in a second mode, wherein, while in said first mode, said counter value is adjusted in response to a difference between said first frequency and a second frequency of a calibration signal.

12. A method for tuning an oscillator, comprising the steps of:

(A) detecting the presence of an input signal oscillating at a first frequency;

(B) generating an output signal oscillating at a second frequency in response to a control signal; and (C) calibrating said control signal when said input signal is present in response to a counter value, wherein said counter value is adjusted in response to a difference between said first frequency and said second frequency.

13. The method according to claim 12, wherein step (C) further comprises:

setting an initial value for said counter value.

14. The method according to claim 13, wherein step (C) further comprises:

passing said initial value to a frequency generator.

15. The method according to claim 12, wherein step (C) further comprises:

increasing said counter value when said first frequency of said input signal is greater than said second frequency of said output signal.

16. The method according to claim 12, wherein step (C) further comprises:

decreasing said counter value when said first frequency of said input signal is less than said second frequency of said output signal.

17. The method according to claim 12, wherein step (C) further comprises:

determining whether said first frequency of said input signal is substantially the same as said second frequency of said output signal.

18. The method according to claim 12, wherein step (C) further comprises:

freezing said counter value when a phase of said input signal and a phase of said output signal are substantially the same.

19. The method according to claim 18, wherein step (C) further comprises:

storing said counter value to a non-volatile memory.

20. The method according to claim 19, wherein step (C) further comprises:

generating said control signal from said stored value.

21. The apparatus according to claim 9, wherein said second circuit further comprises:

a memory configured to (i) present said stored value and (ii) store said counter value in response to one of said plurality of second control signals; and a multiplexer configured to select either said counter value or said stored value as said control signal in response to one of said plurality of second control signals.

22. The apparatus according to claim 21, wherein said memory is non-volatile.

23. The apparatus according to claim 1, wherein said counter value is frozen when said first frequency and said second frequency are substantially the same.

* * * * *